(12) United States Patent
Smith

(10) Patent No.: US 9,806,712 B2
(45) Date of Patent: Oct. 31, 2017

(54) SYSTEMS AND METHODS FOR GESTURE-BASED LIGHTING CONTROL

(71) Applicant: Control4 Corporation, Salt Lake City, UT (US)

(72) Inventor: Wallace Eric Smith, Salt Lake City, UT (US)

(73) Assignee: Control4 Corporation, Salt Lake City, UT (US)

( * ) Notice: Subject to any disclaimer, the term of this patent is extended or adjusted under 35 U.S.C. 154(b) by 260 days.

(21) Appl. No.: 13/829,496

(22) Filed: Mar. 14, 2013

(65) Prior Publication Data

US 2014/0267068 A1    Sep. 18, 2014

(51) Int. Cl.
G06F 3/041    (2006.01)
H03K 17/96    (2006.01)
G06F 3/0488   (2013.01)

(52) U.S. Cl.
CPC ....... H03K 17/962 (2013.01); G06F 3/04883 (2013.01); *H03K 2217/94052* (2013.01); *H03K 2217/96058* (2013.01)

(58) Field of Classification Search
CPC .... G06F 3/0414; G06F 3/044; G06F 3/04883; H03K 17/962; H03K 2217/94052; H03K 2217/96058

USPC .......................... 345/156–174; 315/291–326
See application file for complete search history.

(56) References Cited

U.S. PATENT DOCUMENTS

| 8,098,029 | B2 * | 1/2012 | Newman et al. ............. 315/362 |
| 8,296,669 | B2 * | 10/2012 | Madonna ........... H05B 37/0245 700/17 |
| 2001/0013855 | A1 * | 8/2001 | Fricker ............... G06F 3/03547 345/156 |
| 2007/0290874 | A1 * | 12/2007 | Nearhoof ........... H05B 37/0209 340/815.46 |
| 2009/0231167 | A1 * | 9/2009 | Chen ............................... 341/22 |
| 2012/0032801 | A1 * | 2/2012 | Ujii ........................ G06F 3/016 340/540 |
| 2012/0068832 | A1 * | 3/2012 | Feldstein et al. ............ 340/12.5 |
| 2014/0033136 | A1 * | 1/2014 | St. Clair ................. G06F 3/017 715/863 |
| 2014/0239843 | A1 * | 8/2014 | Hoang .......................... 315/291 |
| 2014/0253471 | A1 * | 9/2014 | Bakalor ................. B60Q 3/044 345/173 |
| 2014/0253483 | A1 * | 9/2014 | Kupersztoch et al. ....... 345/173 |

* cited by examiner

*Primary Examiner* — Rodney Amadiz
(74) *Attorney, Agent, or Firm* — Austin Rapp

(57) ABSTRACT

An electronic device for gesture-based lighting control is described. The electronic device includes a touch sensor that detects a gesture input. The electronic device also includes a lighting operation determination module that determines a lighting operation based on the gesture input. The electronic device further includes a lighting operation execution module that executes the lighting operation.

17 Claims, 10 Drawing Sheets

SYSTEMS AND METHODS FOR GESTURE-BASED LIGHTING CONTROL

TECHNICAL FIELD

The present disclosure relates generally to electronic devices. More specifically, the present disclosure relates to systems and methods for gesture-based lighting control.

BACKGROUND

In recent years, the price of electrical devices has decreased dramatically. In addition, the size of electrical devices has continued to decrease. Further, electrical devices continue to increase in capability and convenience.

Decreasing prices and increasing capabilities of electrical devices have permitted modern devices to be conveniently used in homes and businesses. Many homes and businesses include multiple electrical devices to assist in everyday tasks. While these electrical devices may provide convenience and entertainment, many also require control. The ever-increasing task of electrical device control may be a concern.

With more and more electrical devices being used in homes and businesses, improved control features are needed. As illustrated by this discussion, improved control of electrical devices may be beneficial.

DETAILED DESCRIPTION

An electronic device for gesture-based lighting control is described. The electronic device includes a touch sensor that detects a gesture input. The electronic device also includes a lighting operation determination module that determines a lighting operation based on the gesture input. The electronic device further includes a lighting operation execution module that executes the lighting operation.

The electronic device may be configured to fit in a wall box. The touch sensor may be a capacitive touch sensor. The electronic device may include a lighting load controller that controls at least one lighting load based on the lighting operation.

Executing a lighting operation may include sending a lighting operation indicator that directs another device to control at least one lighting load in accordance with the lighting operation. Detecting a gesture input may include detecting at least one of a gesture input direction, a gesture input speed, a gesture input pressure and a gesture input pattern. A gesture input may include at least one continuous movement contact input.

Detecting a gesture input may be performed independent of a location of the gesture input on the touch sensor. The electronic device may include a status indicator that displays a status of at least one lighting load. The electronic device may execute a non-lighting operation based on the gesture input or another gesture input.

A method for gesture-based lighting control by an electronic device is also described. The method includes detecting a gesture input via a touch sensor. The method also includes determining a lighting operation based on the gesture input. The method further includes executing the lighting operation.

Various configurations of the systems and methods disclosed herein are now described with reference to the figures, where like reference numbers may indicate functionally similar elements. The systems and methods as generally described and illustrated in the figures herein could be arranged and designed in a wide variety of different configurations. Thus, the following more detailed description of several configurations, as represented in the figures, is not intended to limit scope, as claimed, but is merely representative of the systems and methods.

Figure 1:
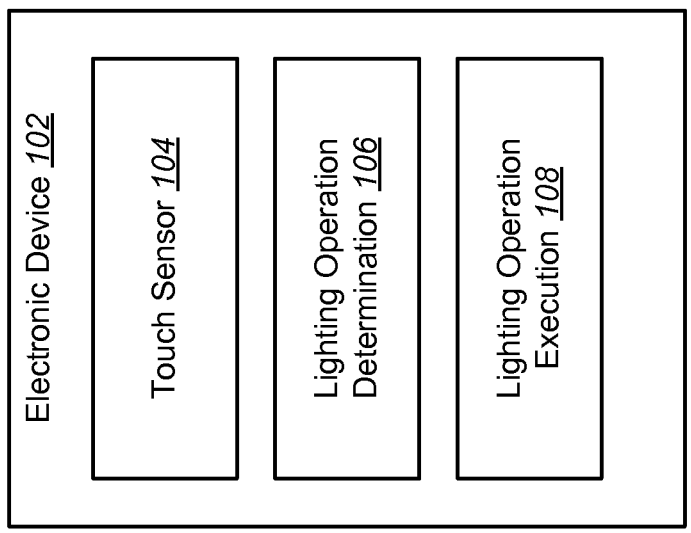
FIG. 1 is a block diagram illustrating one configuration of an electronic device in which systems and methods for gesture-based lighting control may be implemented.

FIG. 1 is a block diagram of one configuration of an electronic device 102 in which systems and methods for gesture-based lighting control may be implemented. Examples of electronic devices 102 may include electronic circuits, integrated circuits, circuits with discrete components (e.g., resistors, capacitors, transistors, etc.), devices with processors, computers, memory cells, latches, logic gates, etc. For instance, the electronic device 102 may include components and a microprocessor that may be used to detect a gesture input, determine a lighting operation and execute the lighting operation. The electronic device 102 may include one or more of a touch sensor 104, a lighting operation determination module 106 and a lighting operation execution module 108. As used herein, a "module" may be implemented in hardware, software, firmware or any combination thereof.

The touch sensor 104 may detect one or more gesture inputs. A gesture input may include at least one continuous movement contact input. A continuous movement contact input may include a change in contact position (e.g., a movement) while an object (e.g., a user's finger or stylus) is in continuous contact with the touch sensor 104. In some implementations, a gesture input may include at least one continuous movement contact input and one or more taps (to generate an "i"-shaped gesture input, for example). In some configurations, a gesture input may not be a single tap input. For instance, a gesture may be indicated by a certain number of taps (in addition to a continuous movement contact input)

and/or a frequency of taps in some configurations. As will be described below, detecting one or more gesture inputs may include detecting one or more of a gesture input direction, a gesture input speed (e.g., gesture input velocity), a gesture input pressure and a gesture input pattern. For example, the touch sensor 104 may detect a contact input based on a change in pressure. In some implementations, the touch sensor 104 may include, or be coupled to, one or more modules that determine gestures.

In some cases, the touch sensor 104 may receive a gesture input from a user's finger swipe. For example, the touch sensor 104 may detect a downward movement contact input from a user's finger. In other cases, the touch sensor 104 may receive a gesture input from a stylus. For example, the touch sensor 104 may detect an upward movement contact input from a stylus. Other examples of gesture inputs include a horizontal gesture input, an angle gesture input, a circle gesture input, an "X"-shaped gesture input and any combination thereof. Other gesture input patterns may additionally or alternatively be utilized. For instance, any predetermined and/or user-defined gesture input may be utilized in some configurations. According to some examples, the touch sensor 104 may detect a multi-touch gesture input. For example, the touch sensor 104 may detect parallel downward gesture inputs received from a user's fingers.

As will be described in connection with FIG. 9, the touch sensor 104 may detect a gesture input independent of the gesture input location on the touch sensor 104 in some configurations. For example, the touch sensor 104 may detect a first instance of a gesture input received at a lower left corner of the touch sensor 104. In this example, the touch sensor 104 may detect a second instance of the same gesture input received at an upper right corner of the touch sensor 104. In other configurations, a gesture input may be based on location. For example, a vertical swipe along the edge of the touch sensor 104 may be interpreted differently from a vertical swipe in the middle of the touch sensor 104. In yet other configurations, a combination of one or more location-based gesture inputs and one or more location-independent gesture inputs may be utilized. For example, a downward vertical swipe on the edge of the touch sensor 104 may indicate a dimming operation, while a downward vertical swipe anywhere else on the touch sensor 104 may indicate a power off operation.

Additionally or alternatively, the touch sensor 104 may detect a gesture independent of the size of the gesture input in some configurations. For example, the touch sensor 104 may detect a first instance of a gesture input that is a first size. The touch sensor 104 may also detect a second instance of the same gesture input that is a different size than the first instance. In another configuration, a gesture input may be based on size. For example, a downward vertical swipe that is less than a threshold length may indicate a dimming operation, while a downward vertical swipe that is greater than or equal to the threshold length may indicate a power off operation. In yet other configurations, a combination of one or more size-based gesture inputs and one or more size-independent gesture inputs may be utilized. For example, vertical swipes of different lengths may indicate different operations, while X-shaped gestures of any size may indicate the same operation. In a similar fashion, as will be described in detail in connection with at least FIG. 5, the touch sensor 104 may detect a gesture that is based on one or more other characteristics of the gesture input (e.g., speed, location, pressure, etc.). The touch sensor 104 may additionally or alternatively detect a gesture that is independent of one or more characteristics of the gesture input (e.g., speed, location, pressure, etc.). As used herein, the term "independent" may refer to a gesture that is not based on a particular characteristic. For example, a speed-independent gesture may indicate the same lighting operation, regardless of the speed of the gesture.

According to some configurations, the touch sensor 104 may be a capacitive touch sensor 104. For example, the touch sensor 104 may use capacitance (e.g., measured capacitance) to detect one or more gesture inputs. In some implementations, the touch sensor 104 may include one or more capacitive zones that detect the one or more gesture inputs. The capacitive zones may detect when a contact input has been received in that capacitive zone. In other implementations, the touch sensor 104 may include a grid of capacitors. For example, the touch sensor 104 may be an X-Y type capacitive touch screen. For example, the touch sensor 104 may include a single layer that has a grid pattern of electrodes. In another example, the touch sensor 104 may include two layers of electrodes arranged in parallel lines. The layers may be positioned perpendicularly to form a grid pattern of electrodes. The capacitors may be identified by an index of the grid. Similarly, the capacitors may detect a contact input. The touch sensor 104 may determine a gesture input by compiling contact location and/or motion information. For example, a gesture input may be detected by receiving information from one or more capacitors (or capacitive zones) that indicates a contact input has been received by those capacitors (or in the capacitive zones). For example, the touch sensor 104 may determine a downward gesture input based on a downward sequence of capacitive zones that indicate a contact input. Additionally or alternatively, the touch sensor 104 may determine a gesture input by determining one or more locations and/or motions of one or more contacts based on changes in an electric field (e.g., capacitance). In other implementations, the touch sensor 104 may be a resistive touch sensor 104.

In some configurations, the electronic device 102 may display the gesture input. For example, one or more light emitting diodes (LEDs) may be positioned behind the touch sensor 104 and may display the gesture input (e.g., a tracer based on the gesture input). The LEDs may illuminate where a gesture input has been received. For example, if the touch sensor 104 detects downward gesture input, LEDs aligned with the gesture input location on the touch sensor 104 may illuminate to indicate the gesture input. The LEDs may dim after a set amount of time after the gesture input has been detected.

The touch sensor 104 may be a glass touch sensor 104. For example, the touch sensor 104 may be a transparent (or partially transparent (e.g., smoked)) glass touch sensor 104. The touch sensor 104 may also be a flat touch sensor 104. For example, the touch sensor 104 may be a flat smoked glass touch sensor 104 of an electronic device 102 that is mounted on a wall. In some examples, the touch sensor 104 may not include a liquid crystal display (LCD), or an organic LED (OLED) display. In some configurations, the electronic device 102 may also include at least one LED to provide backlighting and/or visual indications through the touch sensor 104. The electronic device 102 may not be a media presentation device. A media presentation device may present such media as video and/or audio content. Examples of media presentation devices include tablets (e.g., iPads, Android tablets, etc.), smartphones (e.g., iPhones, Android phones, etc.), personal digital assistants (PDAs) and other media presentation devices (e.g., iPods). The touch sensor 104 may not have moveable components (e.g., mechanical buttons, switches, relays, sliders, etc.).

The lighting operation determination module 106 may determine a lighting operation based on the gesture input. For example, the lighting operation determination module 106 may determine that a downward gesture input may be associated with removing power from the lighting load. A lighting operation may direct the electronic device 102 to control a lighting load. A lighting operation may direct the electronic device 102 to control a lighting load either directly or indirectly. In particular, the electronic device 102 may control a lighting load directly by independently controlling the lighting load (without utilizing another device). For example, a lighting operation may direct the electronic device 102 to remove power from (e.g., shut off, turn off, dim, etc.) a lighting load without communicating with another device. When the electronic device 102 is controlling a lighting load directly, the electronic device 102 may be wired to the load (or include a load controller that is wired to the load).

An example of a lighting operation directing an electronic device 102 to directly control a lighting load is given as follows. In one example, the lighting operation may direct the electronic device 102 to act as a light switch. A light switch may include two discrete states that may be used to control a lighting load. A light switch may be in an "off" state or in an "on" state. Accordingly, a light switch may turn on or off electrical power to the lighting load. The light switch may turn on the lighting load by turning on electrical power to the lighting load or turn off the lighting load by turning off electrical power to the lighting load.

In another example, the lighting operation may direct the electronic device 102 to act as a light dimmer. A light dimmer may include variable states that may be used to control a lighting load. A light dimmer may variably adjust the amount of electrical power that drives the lighting load (e.g., by adjusting the root mean square (RMS) voltage, adjusting pulse-width modulation, adjusting duty cycle, etc.). For example, a light dimmer may provide 0% electrical power, 100% electrical power or some percentage in between. In one configuration, a light dimmer may use a semiconductor (e.g., metal-oxide-semiconductor field-effect transistor (MOSFET), triode for alternating current (TRIAC), transistors, etc.) to control the lighting load. For example, the light dimmer may increase the brightness of the light by increasing the amount of electrical power driven to the lighting load. Similarly, the light dimmer may decrease the brightness of the light by decreasing the amount of electrical power driven to the lighting load. In some configurations, the lighting operation may direct the electronic device 102 to include switching and dimming capabilities.

By comparison, controlling a lighting load indirectly may utilize another device. Examples of other devices may include a second electronic device or a control device (e.g., a home automation controller). For example, a lighting operation (to remove power from a lighting load, for example) may direct the electronic device 102 to send a lighting operation indicator to another electronic device. The lighting operation indicator may direct the other electronic device to remove power from the lighting load. When the electronic device 102 is controlling a lighting load indirectly, the electronic device 102 may communicate with another device that is either wired to the load (e.g., include a load controller that is wired to the load) or communicates with a device that is wired to the load. In some implementations, the lighting operation determination module 106 may determine one or more control type based on a gesture input. For example, a downward gesture input may direct the electronic device 102 to directly control one or more lighting loads and to indirectly control one or more different lighting loads.

Other examples of lighting operations include directing an electronic device 102 to reduce power to one or more lighting loads (e.g., dim the lights), supply power to one or more lighting loads (e.g., turn on the lights) or switch a configuration mode of one or more lighting loads (e.g., switch to an "away" mode, a "security" mode, or an "economy" mode). The different configuration modes of a lighting load may include different settings for the lighting load. For example, a first configuration mode may indicate a schedule for supplying power to one or more lighting loads and may indicate how much power to supply to the one or more lighting loads. It should be noted that the lighting operation determination module 106 may determine different lighting operations for different lighting loads based on a gesture input. For example, a gesture input may indicate a "scene" lighting operation. As used herein, a "scene" lighting operation may include different settings for different lighting loads. For example, a first scene (to be implemented at night, for example) may supply power to one or more lighting loads (exterior lights, for example). The first scene may also remove power from one or more different lighting loads (interior lights, for example).

The lighting operation determination module 106 may determine a lighting operation by recognizing an association between the gesture input and the lighting operation. In some implementations, a lighting operation may be associated with a trained gesture input. For example, as will be described in connection with at least one of FIGS. 6 and 7, one or more electronic devices 102 may generate an association between a particular gesture input and a particular lighting operation. Additionally or alternatively, the lighting operation determination module 106 may determine that a lighting operation is associated with a gesture input based on a pre-determined association. For example, the electronic device 102 manufacturer may include a pre-defined association between a downward gesture input and removing power from a lighting load.

The lighting operation execution module 108 may execute the lighting operation. For example, if the lighting operation directs the electronic device 102 to directly control a lighting load (e.g., remove power, supply power, reduce power or switch a configuration mode), the lighting operation execution module 108 may direct a lighting load controller (of the electronic device 102) to perform the indicated lighting operation. If the lighting operation directs the electronic device 102 to indirectly control a lighting load, the lighting operation execution module 108 may send a lighting operation indicator to another device that directs the other device to control a lighting load in accordance with the lighting operation (e.g., remove power, supply power, reduce power or switch a configuration mode). If the lighting operation determination module 106 determines multiple lighting operations based on the gesture input, the lighting operation execution module 108 may execute the one or more lighting operations.

Figure 2:
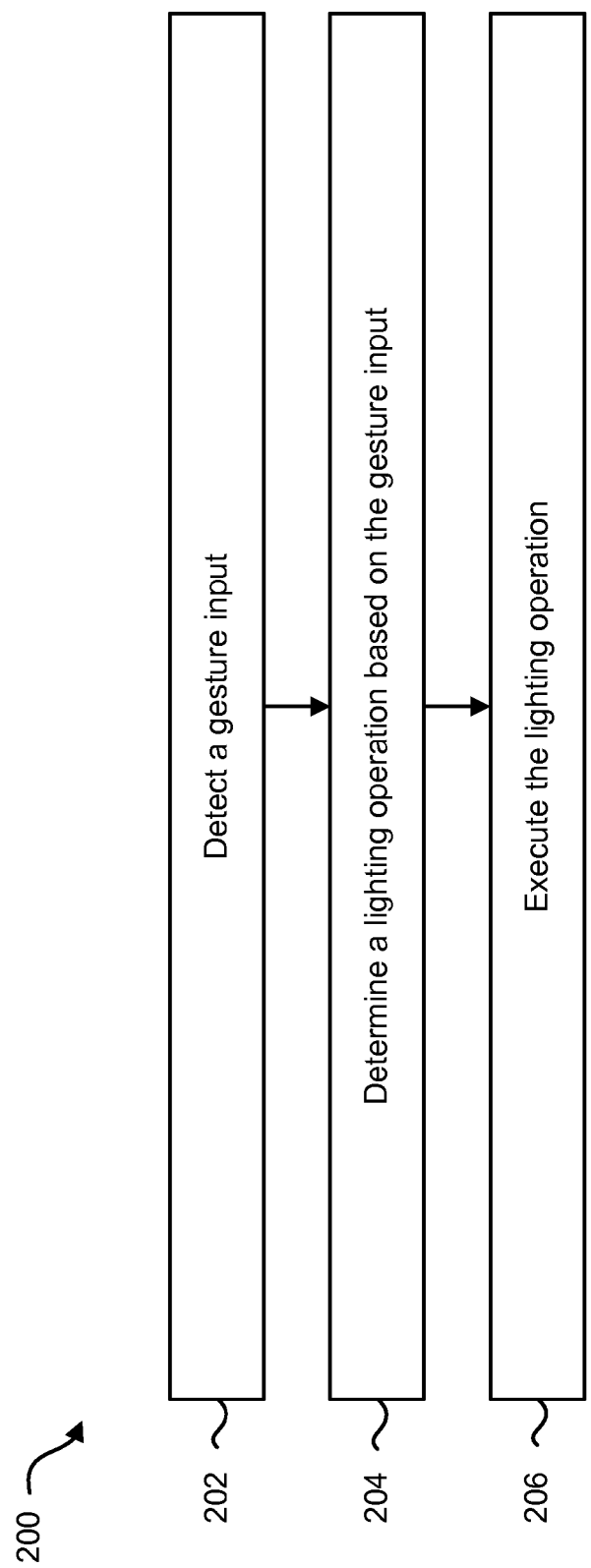
FIG. 2 is a flow diagram illustrating one configuration of a method for gesture-based lighting control by an electronic device.

FIG. 2 is a flow diagram illustrating one configuration of a method 200 for gesture-based lighting control by an electronic device 102. The electronic device 102 may detect 202 a gesture input. For example, the electronic device 102 may detect 202 a gesture input by receiving a gesture input on a touch sensor 104 of the electronic device 102. In some implementations, the gesture input may originate from a user. For example, a user's hand may swipe downward on the touch sensor 104 to generate a downward gesture input.

In another example, the gesture input may originate from another object (a stylus, for example).

In some implementations, the electronic device 102 may detect 202 a gesture input independent of the location on the touch sensor 104 where the gesture input is received. For example, the electronic device 102 may detect 202 a downward gesture input in the upper right corner of the touch sensor 104. In this example, the electronic device 102 may detect 202 the same downward gesture input in the lower left corner of the touch sensor 104. In other words, the electronic device 102 may detect 202 the downward gesture input regardless for the gesture input location on the touch sensor 104.

In some implementations, the electronic device 102 may detect 202 a gesture input independent of a scaling of the gesture input. For example, the touch sensor 104 may detect 202 a first instance of a downward gesture input (that is associated with a lighting operation) that is a first length. The touch sensor 104 may also detect a second instance of the downward gesture input that is a second length. In other words, the electronic device 102 may determine a lighting operation that is associated with a gesture input regardless of the size of the gesture input.

In some examples, the electronic device 102 may detect 202 a gesture input based on capacitance (e.g., measured capacitance) detected on the touch sensor 104. For example, one or more capacitors (or capacitive zones) on the touch sensor 104 may indicate when a touch input is received. For example, the touch sensor 104 may receive information from the capacitors (or capacitive zones) that indicates a touch input. The electronic device 102 may compile the touch input information to detect 202 a gesture input.

The electronic device 102 may determine 204 a lighting operation based on the gesture input. For example, the electronic device 102 may determine 204 that an upward gesture input may be associated with supplying power to one or more lighting loads. As described above, a lighting operation may be an operation that directs an electronic device 102 to control (either directly or indirectly) a lighting load. For example, a lighting operation may direct an electronic device 102 to directly control a lighting load via a lighting load controller of the electronic device 102. By comparison, a lighting operation may direct an electronic device 102 to indirectly control a lighting load by sending a lighting operation indicator to another device. The lighting operation indicator may direct the other device to control a lighting load in accordance with the lighting operation.

Determining 204 a lighting operation based on the gesture input may include determining 204 multiple lighting operations based on the gesture input. For example, a downward gesture input may direct the electronic device 102 to directly control one or more lighting loads and/or to indirectly control one or more different lighting loads.

In some implementations, determining 204 a lighting operation based on the gesture input may include recognizing an association between the gesture input and the lighting operation. In some implementations, a lighting operation may be associated with a trained gesture input. For example, as will be described in connection with at least one of FIGS. 6 and 7, one or more electronic devices 102 may generate an association between a particular gesture input and a particular lighting operation. Additionally or alternatively, the lighting operation determination module 106 may determine 204 that a lighting operation is associated with a gesture input based on a pre-determined association. For example, the electronic device 102 manufacturer may include a pre-defined association between a downward gesture input and removing power from a lighting load.

The electronic device 102 may execute 206 the lighting operation. For example, if the lighting operation directs the electronic device 102 to directly control a lighting load (e.g., remove power, supply power, etc.), the electronic device 102 may execute 206 the lighting operation by directing a lighting load controller (of the electronic device 102) to perform the lighting operation (e.g., remove power, supply power, etc.). By comparison, if the lighting operation directs the electronic device 102 to indirectly control a lighting load (e.g., instruct another electronic device to control a lighting load), the electronic device may execute 206 the lighting operation by sending a lighting operation indicator to another device instructing that device to control the lighting load in accordance with the lighting operation (e.g., remove power, supply power, etc.).

Figure 3:
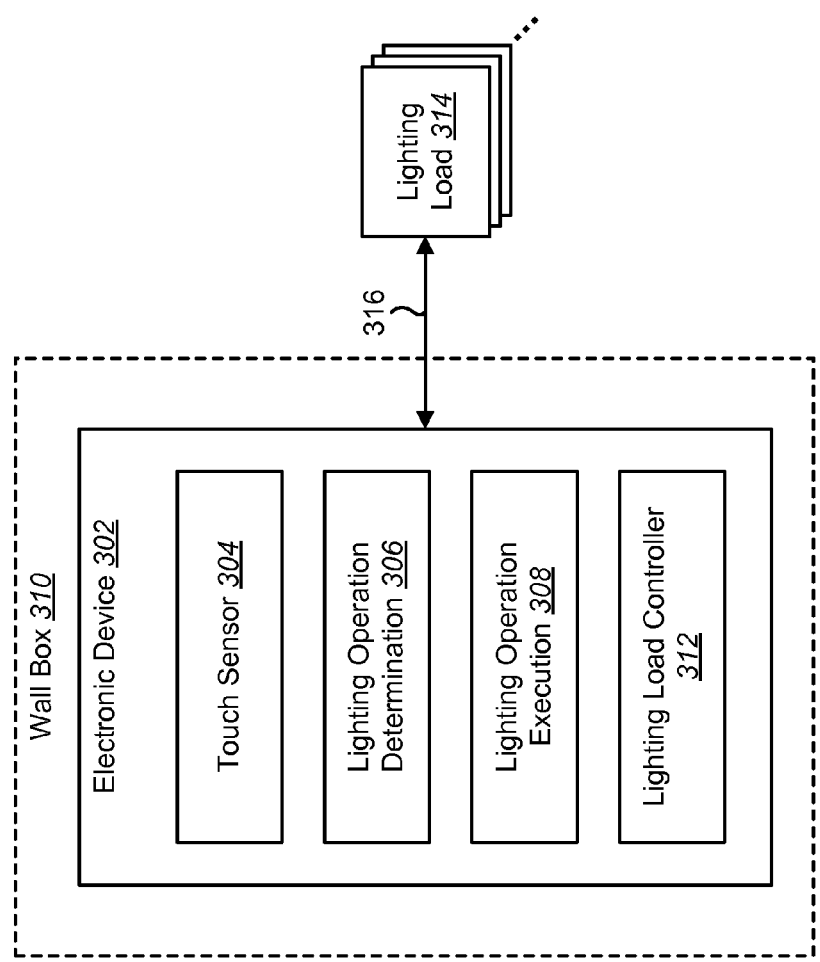
FIG. 3 is a block diagram illustrating a more specific configuration of an electronic device in which systems and methods for gesture-based lighting control may be implemented.

FIG. 3 is a block diagram illustrating a more specific configuration of an electronic device 302 in which systems and methods for gesture-based lighting control may be implemented. The electronic device 302 may be an example of the electronic device 102 described in connection with FIG. 1. The electronic device 302 may include one or more of a touch sensor 304, a lighting operation determination module 306 and a lighting operation execution module 308 that may be examples of corresponding elements described in connection with FIG. 1. The electronic device 302 may include a lighting load controller 312 that controls at least one lighting load 314 based on the lighting operation. For example, the lighting load controller 312 may control one lighting load 314. In another example, the lighting load controller 312 may control multiple lighting loads 314. The multiple lighting loads 314 controlled by the lighting load controller 312 may be grouped together. For example, the lighting loads 314 in a particular region (the main floor of a house, for example) may be controlled by the lighting load controller 312. Examples of lighting loads 314 include incandescent, arc, gas discharge, laser, fluorescent, LED and sulfur lights. The electronic device 302 may be connected to the lighting load 314 via a connection 316. For example, the electronic device 302 may be connected via an electrical wire connection 316 to the at least one lighting load 314.

In some implementations, the electronic device 302 may be configured to fit in a wall box 310. A wall box 310 (e.g., electrical box, outlet box, switch box, pattress, etc.) is the container for the body of an electrical device (e.g., light switch, power outlet). While housed in the wall box 310, the face of the electronic device 302 may be flush with a wall. For example, the touch sensor 304 of the electronic device 302 may be flush with the wall. In general, the width of a wall box 310 may be measured in "gangs," which indicates the number of electrical devices (e.g., light switch, power outlet) that the wall box 310 can hold. For example, a single gang wall box 310 can hold a single electrical device (e.g., light switch, power outlet) and a double gang wall box 310 can hold two electrical devices (e.g., light switch, power outlet) side by side. In some implementations, different instances of the electronic device 302 may be configured to fit in the wall boxes 310 of different gangs. For example, one instance of the electronic device 302 may fit in a single gang wall box 310. In another example, another instance of the electronic device 302 (or another device such as the control device described in connection with FIG. 4) may fit in a double gang wall box 310. In some implementations, the "gang" of the wall box 310 may determine the number of lighting loads 314 that the electronic device 302 may directly control. For example, an electronic device 302 configured to fit in a double gang wall box may have direct control over two lighting loads 314.

The depth of a wall box 310 may be standard depth, shallow depth, or deep depth. In one configuration, a European style wall box 310 having a width of 86 millimeters, a height of 86 millimeters and a depth of 35 millimeters may be used. In another configuration, a United States style, standard depth wall box 310 may be used. The electronic device 302 may include interfacing to interact with the wall box 310. For example, the electronic device 302 may include one or more of securements (e.g., nails, screws, staples, clips, etc.), securement receptacles (e.g., screw holes, pilot holes, brackets, etc.), electrical contacts and alignment mechanisms that allow the electronic device 302 to be installed in the wall box 310.

The lighting load controller 312 may directly control the lighting load 314. For example, the lighting load controller 312 may control the amount of power delivered to the lighting load 314. In one configuration, the lighting load controller 312 may turn on (e.g., enable) the power or turn off (e.g., disable) the power to the lighting load 314. In another configuration, the lighting load controller 312 may adjust the amount of power that is delivered to the lighting load 314 (e.g., enable, disable, adjust duty cycle, etc.). Additionally or alternatively, the lighting load controller 312 may adjust the settings according to or more of a schedule, a configuration mode or a scene.

As described above, a lighting operation may direct the electronic device 302 to directly control the lighting load 314. In this example, the lighting load controller 312 may carry out the lighting operation by directly controlling the lighting load 314. For example, the lighting load controller 312 may receive direction (e.g., a signal, message, command, etc.) from the lighting operation execution module 308 to supply power to the lighting load 314 in accordance with the lighting operation. In this example, the lighting load controller 312 may use one or more circuits and components to supply electrical power to the lighting load 314. In some configurations, the electronic device 302 may additionally or alternatively receive lighting operation indicator(s) from another device and may execute the lighting operation to control the lighting load(s) 314.

Figure 4:
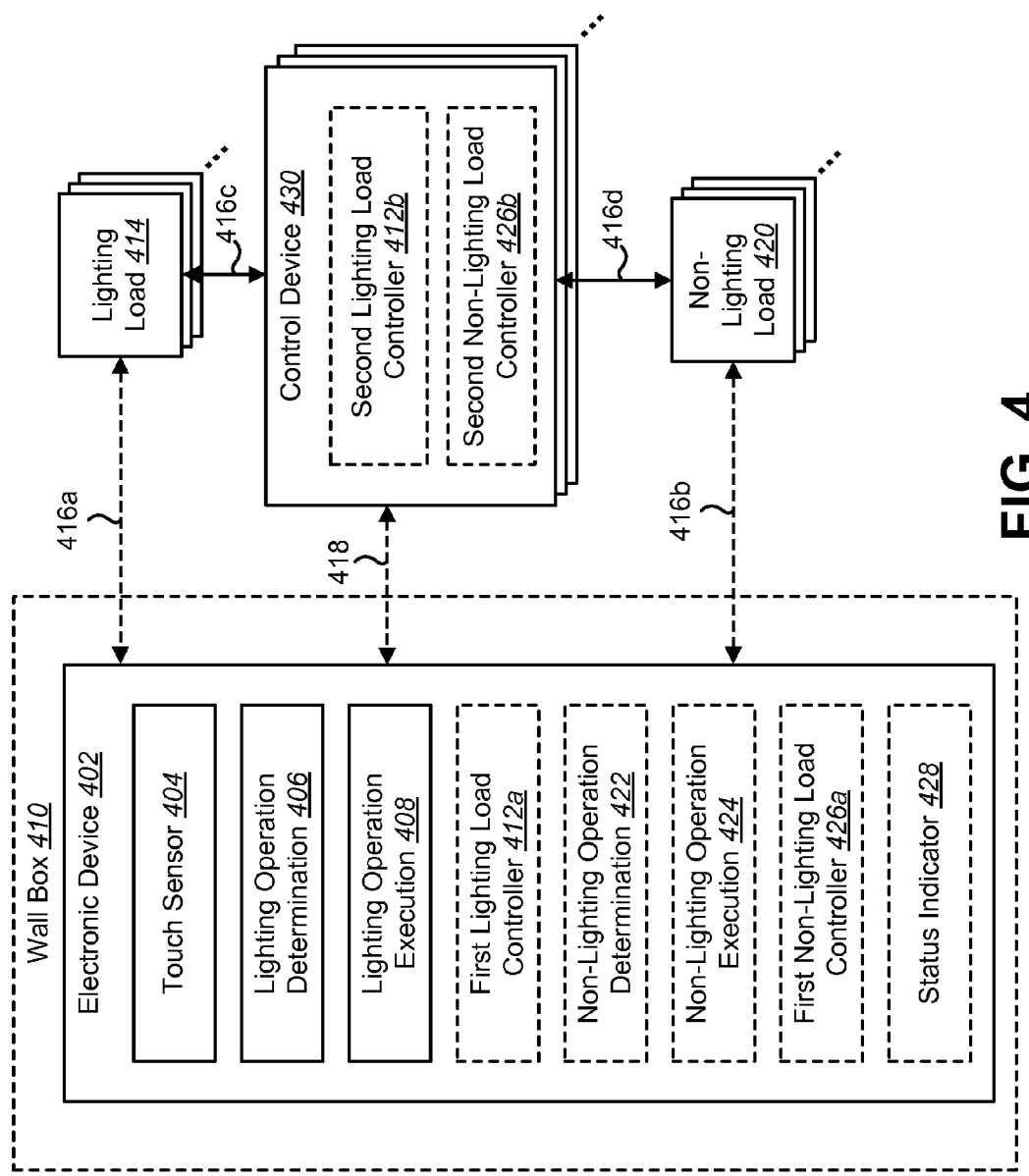
FIG. 4 is a block diagram illustrating a configuration of an electronic device and a control device in which systems and methods for gesture-based lighting control may be implemented.

FIG. 4 is a block diagram illustrating a configuration of an electronic device 402 and a control device 430 in which systems and methods for gesture-based lighting control may be implemented. The electronic device 402 may be an example of the electronic device 102 described in connection with FIG. 1. The electronic device 402 may be configured to fit in a wall box 410 that may be an example of the wall box 310 described in connection with FIG. 3. Additionally or alternatively, the control device 430 may be configured to fit in the same wall box 410 or a separate wall box. Alternatively, the control device 430 may not be configured to fit in a wall box. In some implementations, the control device 430 may be one or more of a home automation controller, another electronic device (similar to the electronic device 402, for example), a device for lighting control and a device for non-lighting control.

The electronic device 402 may include a touch sensor 404, a lighting operation determination module 406 and a lighting operation execution module 408 that may be examples of corresponding elements described in connection with FIG. 1. Optionally, the electronic device 402 may include a first lighting load controller 412a that may be an example of the lighting load controller 312 described in connection with FIG. 3. For example, a lighting operation may direct the electronic device 402 to directly control one or more lighting loads 414. In this example, the electronic device 402 may include a first lighting load controller 412a to directly control the one or more lighting loads 414. The electronic device 402 may directly control the one or more lighting loads 414 (e.g., carry out a lighting operation without communicating with the control device 430), via a connection 416a that may be an example of the connection 316 described in connection with FIG. 3.

Additionally or alternatively, the electronic device 402 may control one or more lighting loads 414 indirectly. For example, the electronic device 402 may send a lighting operation indicator to the control device 430. In some implementations, the electronic device 402 may send the lighting operation indicator to the control device 430 via a connection 418. The connection 418 may be a wireless, wired and/or network (e.g., local area network (LAN)) connection 418. In this example, the control device 430 may include a second lighting load controller 412b that may be an example of the lighting load controller 312 described in connection with FIG. 3. An example is given as follows. The electronic device 402 may receive a gesture input that indicates a lighting operation (e.g., supply power to one or more lighting loads 414) and that directs the electronic device 402 to indirectly control the one or more lighting loads 414. In this example, the control device 430 may receive the lighting operation indicator and may control (via the second lighting load controller 412b, for example) the one or more lighting loads 414 in accordance with the lighting operation (e.g., supply power to the one or more lighting loads 414). The control device 430 may control the one or more lighting loads 414 via a connection 416c that may be an example of the connection 316 described in connection with FIG. 3.

It should be noted that the electronic device 402 may control one or more lighting loads 414 directly and/or one or more lighting loads 414 indirectly. For example, the electronic device 402 may both control a lighting load 414 via the first lighting load controller 412a (e.g., directly control) and control a lighting load 414 by sending a lighting operation indicator to the control device 430 (e.g., indirectly). In some implementations, the lighting loads 414 that the electronic device 402 controls directly may be different than the lighting loads 414 that the electronic device 402 controls indirectly. For example, the electronic device 402 may directly control one or more lighting loads 414 in a particular region of a building (the main floor, for example). In this example, the electronic device 402 may indirectly control one or more different lighting loads 414 in another particular region of a building (the basement, for example). The lighting loads 414 in the other particular region of the building (e.g., the basement) may be directly controlled by the control device 430.

An example of controlling lighting loads 414 is given as follows. A lighting operation may direct the electronic device 402 to remove power from all lighting loads 414 in a building. In another example, a lighting operation may alter the configuration mode of all the lighting loads 414 in a building. In these examples, the electronic device 402 may directly control one or more lighting loads 414 and the control device 430 may directly control one or more different lighting loads 414. In this example, the touch sensor 404 of the electronic device 402 may detect the gesture input associated with the lighting operation (e.g., to remove power from all lighting loads 414 in the building). In this example, the electronic device 402 may directly control the lighting loads 414 that it has direct control over. The electronic device 402 may also indirectly control the lighting loads 414 that it does not have direct control over. That is to say, the electronic device 402 may carry out the lighting operation by both controlling directly one or more lighting loads 414 (via the first lighting load controller 412*a*) and controlling indirectly the one or more different lighting loads 414 (by sending an operation indicator to the control device 430, which then controls the one or more different lighting loads 414 via the second lighting load controller 412*b*).

In some implementations, the electronic device 402 may execute a non-lighting operation based on the gesture input or another gesture input. For example, a gesture input may be associated with one or more lighting operation(s) and one or more non-lighting operation(s). By comparison, a first gesture input may be associated with one or more lighting operation(s) and a second gesture input may be associated with one or more non-lighting operation(s). In these implementations, the electronic device 402 may include one or more of a non-lighting operation determination module 422, a non-lighting operation execution module 424 and a first non-lighting load controller 426*a*. The non-lighting operation determination module 422 may determine a non-lighting operation based on the gesture input or another gesture input. For example, the non-lighting operation determination module 422 may determine that a circle gesture input may be associated with removing power from the non-lighting load 420. A non-lighting operation may direct the electronic device 402 to control one or more non-lighting loads 420. A non-lighting operation may direct the electronic device 402 to control a non-lighting load 420 either directly or indirectly. Controlling a non-lighting load 420 directly may not include utilizing another device (e.g., the control device 430). By comparison, controlling a non-lighting load 420 indirectly may include utilizing another device (e.g., the control device 430). Examples of non-lighting loads 420 include media devices (e.g., radios, receivers, televisions, digital video disc (DVD) player), heating devices (e.g., thermostat) and other electrical and/or electronic loads. Examples of non-lighting operations include reducing power to a non-lighting load 420, supplying power to non-lighting load 420, switching a configuration mode of a non-lighting load 420 (e.g., switching to an "away" mode, a "security" mode or an "economy" mode), playing media, activating a security system, switching a device input, adjusting a thermostat, establishing a part of a "scene," etc. A "scene" may include one or more settings of one or more electrical and/or electronic devices. For example, a "scene" could include closing automated blinds, dimming the lights, turning on a television and beginning movie or music playback.

The non-lighting operation determination module 422 may determine that a particular non-lighting operation is associated with a particular gesture input. For example, the non-lighting operation determination module 422 may determine that a counter-clockwise circle gesture input may be associated with rewinding an audio track. In some implementations, the non-lighting operation determination module 422 may determine that a non-lighting operation is associated with a trained gesture input. For example, a user may generate an association between a particular gesture input and a non-lighting operation. By comparison, the non-lighting operation determination module 422 may determine that the non-lighting operation is associated with a gesture input based on a pre-determined relationship. For example, the electronic device 402 manufacturer may include a pre-defined association between a circle gesture input and rewinding a media track.

The non-lighting operation execution module 424 may execute the non-lighting operation. For example, if the non-lighting operation directs the electronic device 402 to rewind an audio track, the non-lighting operation execution module 424 may direct the first non-lighting load controller 426*a* to perform the indicated non-lighting operation.

Optionally, the first non-lighting load controller 426*a* may directly control one or more non-lighting loads 420. For example, a non-lighting operation may direct the electronic device 402 to directly control one or more non-lighting loads 420. In this example, the electronic device 402 may include a first non-lighting load controller 426*a* to directly control the one or more non-lighting loads 420. The electronic device 402 may directly control the one or more non-lighting loads 420 (e.g., carry out a non-lighting operation without utilizing the control device 430), via a connection 416*b* that may be an example of the connection 316 described in connection with FIG. 3.

Additionally or alternatively, the electronic device 402 may control one or more non-lighting loads 420 indirectly. For example, the electronic device 402 may send a non-lighting operation indicator to one or more other devices. One or more of the other devices may be capable of controlling lighting load(s) 414, non-lighting load(s) or both (e.g., the control device 430). In some implementations, the electronic device 402 may send the non-lighting operation indicator to the control device 430 via a connection 418. The connection 418 may be either wireless or a wired connection 418. In this example, the control device 430 may include a second non-lighting load controller 426*b* that directly controls one or more non-lighting loads 420 via the connection 416*d* that may be an example of the connection 316 described in connection with FIG. 3.

It should be noted that the electronic device 402 may control one or more non-lighting loads 420 directly (via the first non-lighting load controller 426*a*), and one or more non-lighting loads 420 indirectly (by sending a non-lighting operation indicator to the control device 430). It should also be noted that the electronic device 402 may execute one or more lighting operations and one or more non-lighting operations simultaneously. For example, the touch sensor 404 may receive a gesture input (or multiple gesture inputs) that indicate a lighting operation (removing power from all lighting loads 414) and a non-lighting operation (removing power from all non-lighting loads 420). Accordingly, the electronic device 402 may execute the lighting operation and the non-lighting operation by controlling the lighting loads 414 and the non-lighting loads 420, either directly or indirectly as described herein.

In some configurations, the electronic device 402 may include a status indicator 428 that indicates the status of at least one lighting load 414. For example, the status indicator 428 may include one or more LEDs that are located behind the touch sensor 404 that display a status of at least one lighting load 414. For example, if a lighting load 414 is turned "on," the status indicator 428 (e.g. the one or more LEDs) may include a textual indication (e.g., the word "on" indicating that the lighting load 414 has been supplied electrical power. In another example, the status indicator 428 (e.g., the one or more LEDs) may glow a particular color indicating that the lighting load 414 has been supplied electrical power.

Figure 5:
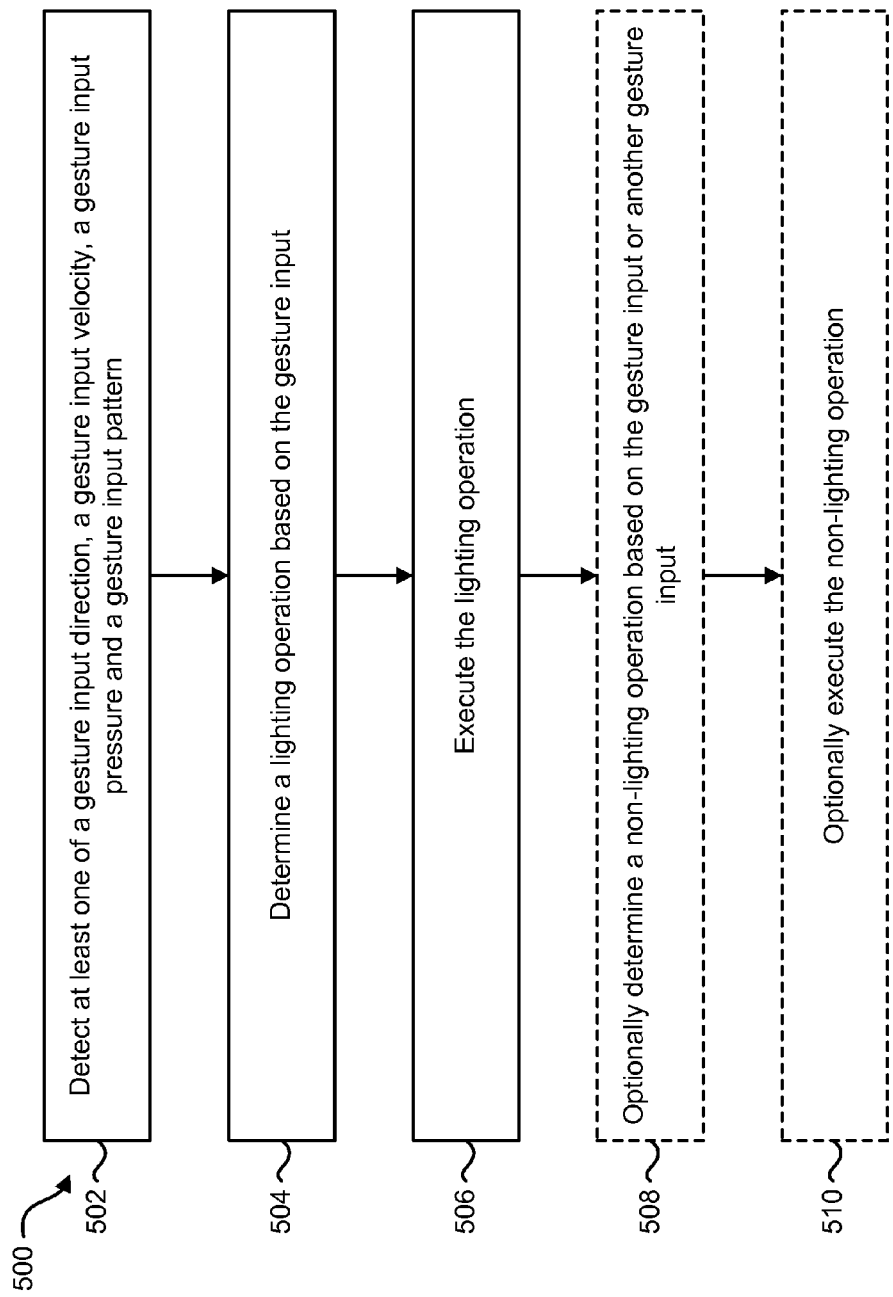
FIG. 5 is a flow diagram illustrating a more specific configuration of a method for gesture-based lighting control by an electronic device.

FIG. 5 is a flow diagram illustrating a more specific configuration of a method 500 for gesture-based lighting control by an electronic device 402. The electronic device 402 may detect 502 at least one of a gesture input direction, a gesture input speed (e.g., gesture input velocity), a gesture input pressure and a gesture input pattern. More specifically, the touch sensor 404 may detect 502 at least one of a gesture input direction, a gesture input velocity, a gesture input pressure and a gesture input pattern. In some implementations, different characteristics of the gesture input may indicate different lighting operations. Gesture inputs in the same direction (e.g., downward) but with different velocities or pressures may indicate different lighting operations. For example, the touch sensor 404 may detect a first downward gesture input at a first velocity. Similarly, the touch sensor 404 may detect a second downward gesture input at a second velocity that is less than the first velocity. In this example, the first downward gesture input (at the first velocity) may indicate a lighting operation that directs the electronic device 402 to remove power from one or more lighting loads 414. In other words, the first downward gesture input at the first velocity may indicate a lighting operation that directs the electronic device 402 to act as a light switch. By comparison, the second downward gesture input (at the second velocity) may indicate a lighting operation that directs the electronic device 402 to reduce the power supplied to one or more lighting loads 414 by a lesser degree. In other words, the second downward gesture input at the second velocity may indicate a lighting operation that directs the electronic device 402 to act as a light dimmer.

In another example, an upward gesture input at a first velocity may direct an electronic device 402 to supply power to the one or more lighting loads 414 under direct control of the electronic device 402. By comparison, an upward gesture motion at a second velocity (that may be greater than the first velocity) may indicate a lighting operation that directs the electronic device 402 to turn on one or more lighting loads 414 directly and to turn on one or more different lighting loads 414 indirectly (via another device, for example). According to some implementations, gesture inputs in the same direction (e.g., downward) but at different locations on the touch sensor 404 may indicate different lighting operations. For example, the touch sensor 404 may detect a first downward gesture input at a first location of the touch sensor 404 (e.g., the edge of the touch sensor 404). Similarly, the touch sensor 404 may detect a second downward gesture input at a second location of the touch sensor 404 that is different than the first location (e.g. the middle of the touch sensor 404) In this example, the first downward gesture input (at the first location) may indicate a lighting operation that directs the electronic device 402 to reduce the power supplied to one or more lighting loads by a particular percentage. By comparison, the second downward gesture input (at the second location) may indicate a lighting operation that directs the electronic device 402 to remove power from one or more lighting loads 414.

According to some implementations, gesture inputs in the same direction (e.g., downward) but with different lengths may indicate different lighting operations. For example, the touch sensor 404 may detect a first downward gesture input at a first length. Similarly, the touch sensor 404 may detect a second downward gesture input at a second length that is less than the first length. In this example, the first downward gesture input (at the first length) may indicate a lighting operation that directs the electronic device 402 to remove power from one or more lighting loads 414. By comparison, the second downward gesture input (at the second length) may indicate a lighting operation that directs the electronic device 402 to reduce the power supplied to one or more lighting loads 414 by a particular percentage.

In a similar fashion, gesture inputs with different input pressures may indicate different lighting operations. For example, a downward gesture input at a first pressure may indicate a lighting operation that directs the electronic device 402 to remove power from one or more lighting loads 414 under direct control of the electronic device 402 (e.g., via a first lighting load controller 412a). By comparison, a downward gesture input at a second pressure (that may be greater than the first pressure) may indicate a lighting operation that directs the electronic device 402 to remove power from all lighting loads 414 in a building, which may include removing power from one or more lighting loads 414 directly and removing power from one or more different lighting loads 414 indirectly (via the control device 430 and the second lighting load controller 412b, for example).

In some implementations, the electronic device 402 may detect a gesture input pattern. For example, as described above, a gesture input may include one or more continuous movement contact inputs. In this example, the electronic device 402 may detect a pattern in the one or more continuous movement contact inputs. For example, a first gesture input may include an angled downward direction. A second gesture may include an angled upward direction resulting in an X-shaped gesture input. Many other gesture patterns (e.g., shapes) may be utilized, which may include one or more contacts. For instance, shapes (e.g., squares, rectangles, triangles, crosses, etc.), characters (e.g., letters, symbols, etc.) and/or other unique symbols may be used. In some configurations, concurrent contacts may be utilized (e.g., multi-touch gestures such as pinch gestures, spread gestures, parallel swipes, etc.). In these examples, the electronic device 402 may recognize the gesture input and determine a corresponding lighting operation based on the gesture input.

The electronic device 402 may determine 504 a lighting operation based on the gesture input. In some implementations, this may be done as described in connection with FIG. 2.

The electronic device 402 may execute 506 the lighting operation. In some implementations, this may be done as described in connection with FIG. 2.

Optionally, the electronic device 402 may determine 508 a non-lighting operation based on the gesture input or another gesture input. For example, the electronic device 402 may determine that a counter-clockwise circle gesture input may be associated with rewinding an audio track. As described above, a non-lighting operation may be any operation that directs an electronic device 402 to control (either directly or indirectly) one or more non-lighting loads 420. For example, a non-lighting operation may direct the electronic device 402 to directly control a non-lighting load 420 via a first non-lighting load controller 426a of the electronic device 402. By comparison, a non-lighting operation may direct an electronic device 402 to indirectly control a non-lighting load 420 by sending a non-lighting operation indicator to another device (e.g., the control device 430). The non-lighting operation indicator may direct the other device to control a non-lighting load 420 in accordance with the non-lighting operation.

It should be noted that determining 508 a non-lighting operation may be based on the same gesture input as used to indicate a lighting operation. For example, an X-shaped gesture input may direct the electronic device 402 to remove power from one or more lighting loads 414 (either directly or indirectly) and to remove power from one or more non-lighting loads 420 (either directly or indirectly). Alternatively, determining 508 a non-lighting operation may be based on a gesture input distinct from the gesture input used to indicate a lighting operation.

In some implementations, determining 508 a non-lighting operation based on the gesture input may include recognizing an association between the gesture input and the non-lighting operation. For example, the electronic device 402 may determine 508 that an upward gesture input may be associated with supplying power to at least one non-lighting load 420. In some implementations, a non-lighting operation may be associated with a trained gesture input. For example, one or more electronic devices 402 may generate an association between a gesture input (a user-generated gesture input, for example) and a non-lighting operation. By comparison, the electronic device 402 may determine 508 that a lighting operation is associated with a gesture input based on a pre-determined association. For example, the electronic device 402 manufacturer may configure the electronic device 402 to associate a particular non-lighting operation (e.g., supply power to a non-lighting load 420) with a particular gesture input (e.g., an upward gesture input).

Optionally, the electronic device 402 may execute 510 the non-lighting operation. For example, if the non-lighting operation directs the electronic device 402 to directly control a non-lighting load 420 (e.g., remove power, supply power, etc.), the electronic device 402 may execute 510 the non-lighting operation by directing the first non-lighting load controller 426a to perform the non-lighting operation (e.g., remove power, supply power, etc.). By comparison, if the non-lighting operation directs the electronic device 402 to indirectly control a non-lighting load 420 (e.g., direct the control device 430 to control a non-lighting load 420), the electronic device 402 may execute 510 the non-lighting operation by sending a lighting operation indicator to the control device 430 directing the control device 430 to control the non-lighting load 420 in accordance with the non-lighting operation (e.g., remove power, supply power, etc.).

Figure 6:
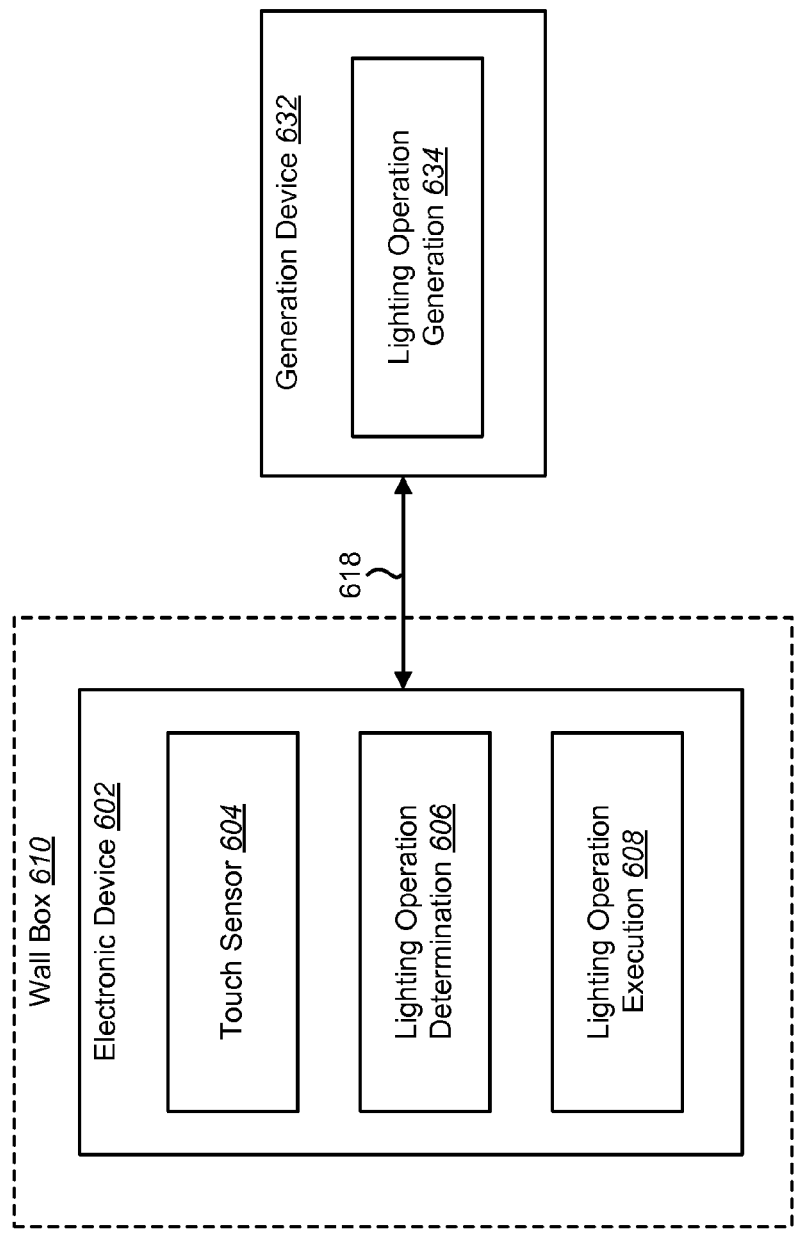
FIG. 6 is a block diagram illustrating one configuration of an electronic device and a generation device in which systems and methods for gesture-based lighting control may be implemented.

FIG. 6 is a block diagram illustrating one configuration of an electronic device 602 and a generation device 632 in which systems and methods for gesture-based lighting control may be implemented. The electronic device 602 may be an example of the electronic device 102 described in connection with FIG. 1. The generation device 632 may be a device that allows the electronic device 602 to generate an association between a particular gesture and one or more particular lighting (and/or non-lighting) operations. Examples of the generation device 632 may include a desktop computer, a laptop computer, a smartphone, a personal digital assistant (PDA), a gaming system and a tablet. In some implementations, the generation device 632 may include all, or part of, the functionality of the control device 430 described in connection with FIG. 4.

The electronic device 602 and the generation device 632 may be connected via a connection 618 that may be an example of the connection 418 described in connection with FIG. 4. For example, in some implementations, the generation device 632 may be connected to the electronic device 602 via Institute of Electrical and Electronics Engineers (IEEE) 802.11 (WiFi) connection 618. One or more of the electronic device 602 and the generation device 632 may be configured to fit in a wall box 610 that may be an example of the wall box 310 described in connection with FIG. 3. The electronic device 602 may include a touch sensor 604, a lighting operation determination module 606 and a lighting operation execution module 608 that may be examples of corresponding elements described in connection with FIG. 1.

As described above, in some implementations, the electronic device 602 and the generation device 632 may generate an association between the gesture input and one or more lighting operations. In some implementations, generating an association between the gesture input and one or more lighting operations may be done in a training mode. For example, while in a training mode, the electronic device 602 may obtain, assign and/or determine associations between particular gestures and particular lighting (and/or non-lighting) operations.

An example is given as follows. The touch sensor 604 may detect a gesture input. The electronic device 602 may then send the gesture input data to the generation device 632.

A lighting operation generation module 634 may then generate an association between the received gesture input and one or more lighting (and/or non-lighting) operations. For example, upon receiving gesture input data, the generation device 632 may display the gesture input and produce a prompt for selection of a desired lighting operation to associate with the received gesture input. For example, the generation device 632 may display a received gesture input (a downward gesture input) and produce a prompt from which a user may select a lighting operation to associate with the downward gesture input. In some implementations, the generation device 632 may include a number of pre-defined lighting operations that may be selected to associate with the received gesture input. Additionally or alternatively, the generation device 632 may enable custom operation programming, which may be associated with the indicated gesture.

In some implementations, the lighting operation generation module 634 may include circuitry and/or components that configure the generation device 632 to generate the association between the received gesture input and one or more lighting operations. In some configurations, the generation device 632 (e.g., the lighting operation generation module 634) may allow for device registration by scanning a code on the electronic device 602 with an Internet-connected mobile device (e.g., the generation device 632) that is running an application. This may assist in original installation of the electronic device 602. For instance, registering the generation device 632 may enable communication between the electronic device 602 and the generation device 632. Accordingly, the electronic device 602 and generation device 632 may exchange information that allows the generation device 632 to generate the association. An example is given as follows. The generation device 632 may include a scanning module (e.g., barcode scanner, camera) that may scan a matrix barcode (e.g., a quick response (QR) code) that may be displayed on the electronic device 602. In some implementations, the code may be printed on the electronic device 602 or attached to the electronic device 602 (e.g., the code may be printed on a sticker that is affixed to the electronic device 602). After scanning the matrix barcode (e.g., the QR code), the lighting operation generation module 634 may allow the generation device 632 to generate the association. For example, the lighting operation generation module 634 may direct the generation device 632 to a website for generating the association, or the lighting operation generation module 634 may install software onto the generation device 632 that allows the generation device 632 to generate the association. In other implementations, the generation device 632 may use specialized software to generate the association.

After generating an association, the generation device 632 may send lighting operation data to the electronic device 602. The lighting operation data may indicate the generated association between the gesture input and the lighting operation to the electronic device 602. Additionally, the lighting operation data may include instructions that may be utilized by the electronic device 602 to execute the lighting operation. In some implementations, the electronic device 602 may then store the gesture input and the association to a memory location on the electronic device 602. The lighting operation execution module 608 may execute the lighting operation that was indicated by the gesture input. In other implementations, the electronic device 602 may wait until a subsequent instance of the gesture input is received before determining the lighting operation and executing the lighting operation.

Figure 7:
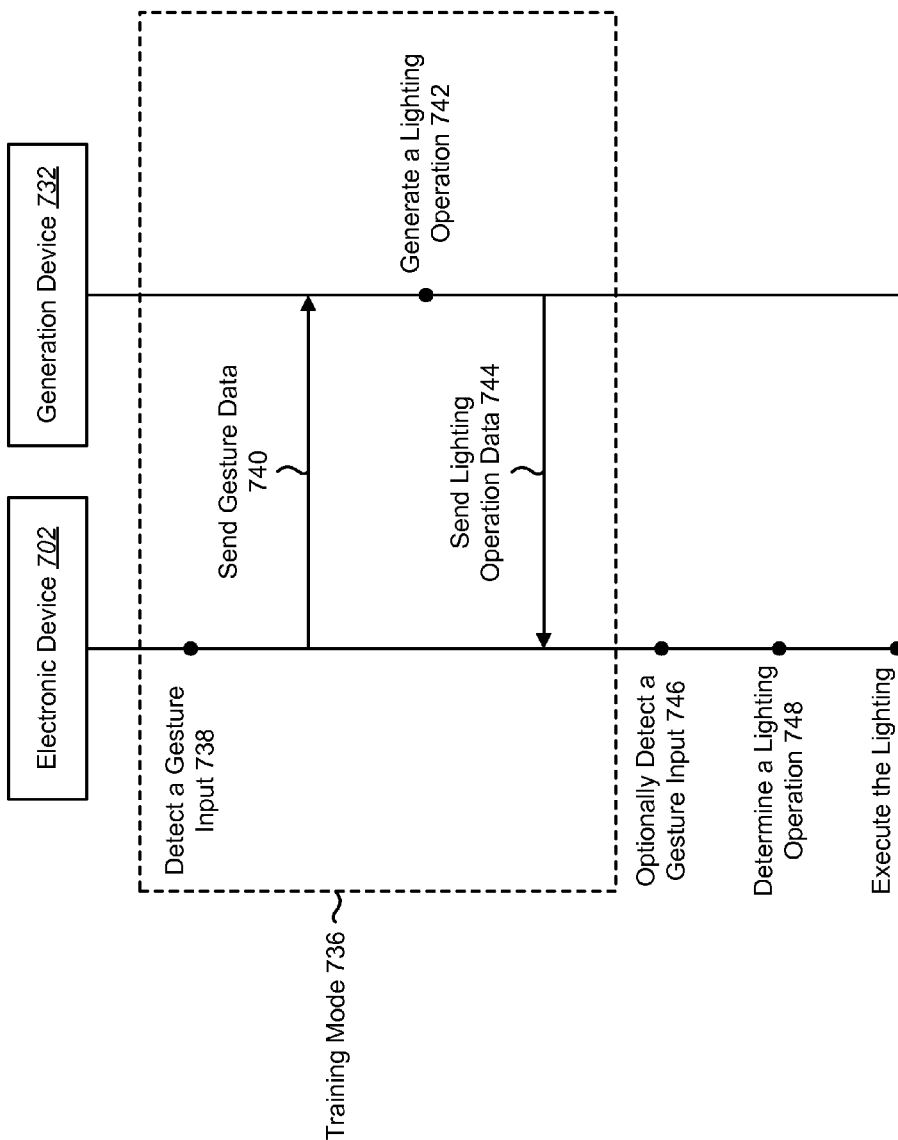
FIG. 7 is a thread diagram illustrating one example of gesture-based lighting control by an electronic device and a generation device.

FIG. 7 is a thread diagram illustrating one example of gesture-based lighting control by an electronic device 702 and a generation device 732. The electronic device 702 and the generation device 732 may be examples of corresponding elements described in connection with at least one of FIG. 1 and FIG. 6. As described above, in some implementations, the electronic device 702 may operate in a training mode 736. In the training mode 736, the electronic device 702 may generate an association between a gesture input and a lighting operation. The electronic device 702 may detect 738 a gesture input. In some implementations, this may be performed as described in connection with one or more of FIGS. 1 and 5.

The electronic device 702 may then send 740 data corresponding to the gesture input to the generation device 732. For example, the electronic device 702 may send 740 data that indicates one or more of a gesture input direction, a gesture input velocity, a gesture input pressure, a gesture input location, a gesture input size and a gesture input pattern to the generation device 732.

The generation device 732 may then generate 742 a lighting operation based on the gesture input. The generation device 732 may generate 742 an association between the received gesture input and one or more lighting operations. For example, upon receiving circle gesture input data, the generation device 732 may display the circle gesture input and produce a prompt for selection of a desired lighting operation to associate with the circle gesture input. In some implementations, the generation device 732 may include a number of pre-defined lighting operations that may be selected to associate with the received gesture input. The generation device 732 may receive instructions (e.g., user programming) and/or a set of function selections to define a lighting operation.

In some implementations, the generation device 732 may include circuitry and/or components that configure the generation device 732 to generate the association between the received gesture input and one or more lighting operations. For example, the generation device 732 may include a scanning module (e.g., barcode scanner, camera) that may scan a matrix barcode (e.g., a quick response (QR) code) that may be displayed on the electronic device 702. After scanning the matrix barcode, the generation device 732 may generate the association. In other implementations, the generation device 732 may use specialized software to generate the association.

After generating 742 a selected lighting operation (e.g., supply power to all lighting loads 414 in the house) to be associated with the circle gesture input, the generation device 732 may send 744 lighting operation data to the electronic device 702. Lighting operation data may include the lighting operation to be performed (e.g., lighting operation instructions) and other data (e.g., association data) that may allow the electronic device 702 to determine the lighting operation based on the gesture input.

The electronic device 702 may then store the lighting operation data to a memory location of the electronic device 702. In some implementations, the electronic device 702 may optionally detect 746 a new instance of the gesture input. In other implementations, the electronic device 702 may simply rely on the detection 738 of the gesture input that was performed earlier (e.g., perform the lighting operation without another instance of the gesture input). In either case, the electronic device 702 may then determine 748 a lighting operation based on the gesture input. In some implementations, this may be performed as described in connection with FIG. 2.

The electronic device 702 may then execute 750 the lighting operation. In some implementations, this may be performed as described in connection with FIG. 2.

Figure 8:
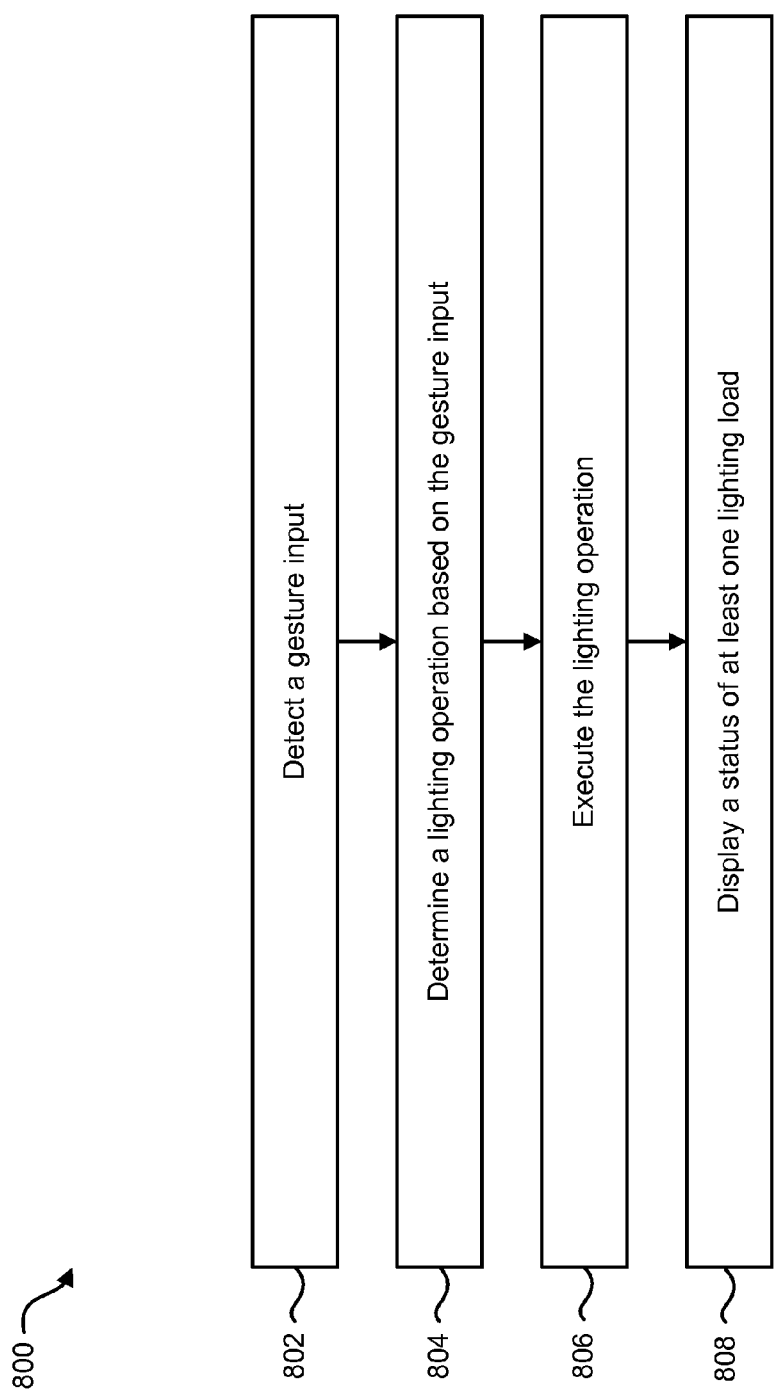
FIG. 8 is a flow diagram illustrating another more specific configuration of a method for gesture-based lighting control by an electronic device.

FIG. 8 is a flow diagram illustrating another more specific configuration of a method 800 for gesture-based lighting control by an electronic device 102. The electronic device 102 may detect 802 a gesture input. In some implementations, this may be performed as described in connection with FIG. 2.

The electronic device 102 may determine 804 a lighting operation based on the gesture input. In some implementations, this may be performed as described in connection with FIG. 2.

The electronic device 102 may execute 806 the lighting operation. In some implementations, this may be performed as described in connection with FIG. 2.

The electronic device 102 may display 808 a status of at least one lighting load 414. As described above, in some implementations, the electronic device 102 may include a status indicator 428 that may display 808 the status of at least one lighting load 414. For example, after completing a lighting operation to supply power to one or more lighting loads 414, the electronic device 102 (via the status indicator 428) may indicate the status (e.g., turned "on") of the lighting loads 414. In some implementations, the electronic device 102 may display 808 the status via one or more LEDs positioned behind the touch sensor 104 (e.g., a flat smoked glass touch sensor 104). For example, the status indicator 428 (e.g. the one or more LEDs) may display 808 a textual indication (e.g., the word "on") indicating that the lighting load 414 has been supplied electrical power. In another example, the status indicator 428 (e.g., the one or more LEDs) may glow a particular color indicating that the lighting load 414 has been supplied electrical power. In yet another example, the status indicator 428 (e.g., one or more LEDs) may be turned off while the lighting load 414 is activated and may be turned on while the lighting load 414 is deactivated (e.g., turned off).

Figure 9:
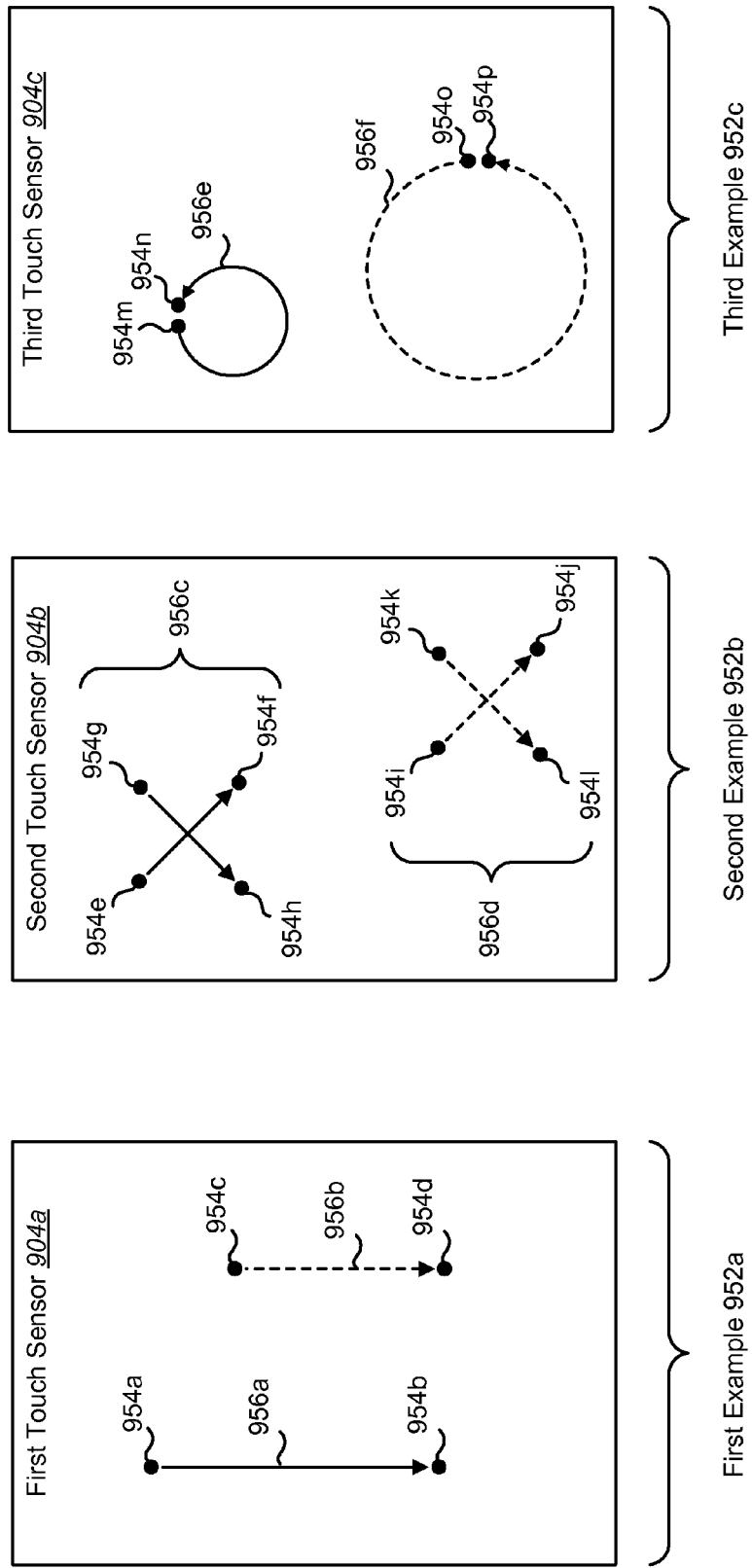
FIG. 9 illustrates examples of the detection of gesture inputs used in gesture-based lighting control.

FIG. 9 illustrates examples 952 of the detection of gesture inputs used in gesture-based lighting control. A described above, in some implementations, a touch sensor 904 may detect an instance 956 of a gesture input independent of the location of the gesture input. Additionally or alternatively, the touch sensor 904 may detect an instance of a gesture input independent of the scaling of the gesture input in some implementations. Accordingly, the electronic device 102 may determine the lighting operation associated with the gesture input independent of the size and location of the gesture input in some configurations. However, in other configurations, differences in size and/or location may be utilized to distinguish different lighting operations.

In a first example 952a, a first instance 956a of a downward gesture input may indicate a lighting operation (e.g., removing power from one or more lighting loads 414) and a second instance 956b of the downward gesture input may indicate the same lighting operation (e.g., removing power from one or more lighting loads 414). The first instance 956a may be generated by making contact with the first touch sensor 904a at one point 954a and applying a continuous movement contact input to another point 954b. In some implementations, the first instance 956a may be detected during a training mode. A second instance 956b of the downward gesture input may be generated by making contact with the first touch sensor 904a at one point 954c and applying a continuous movement contact input to another point 954d. As described above, the first touch sensor 904a may detect both the first instance 956a and the second instance 956b of the downward gesture input notwithstanding the first instance 956a and the second instance 956b are of different lengths and detected at different locations on the first touch sensor 904a. Accordingly, the electronic device 102 may determine the lighting operation based on the gesture input and execute the lighting operation.

The second example 952b depicts a first instance 956c of an X-shaped gesture input that may indicate a lighting operation (e.g., removing power from all lighting loads 414 in a building) and a second instance 956d of the X-shaped gesture input may indicate the same lighting operation (e.g., removing power from all lighting loads 414 in a building). The first instance 956c may be generated by making contact at a point 954e and making a first downward angled contact movement to another point 954f and by making contact with a point 954g and making a second downward angled contact movement (that may be approximately perpendicular to the first downward angled contact movement, for example) to another point 954h. The second instance 956d may be generated by making contact at a point 954i and making a first downward angled contact movement to another point 954j and by making contact with a point 954k and making a second downward angled contact movement (that may be approximately perpendicular to the first downward angled contact movement, for example) to another point 954l. As described above, the second touch sensor 904b may detect both the first instance 956c and the second instance 956d of the X-shaped gesture input notwithstanding the first instance 956c and the second instance 956d detected at different locations on the second touch sensor 904b. Accordingly, the electronic device 102 may determine the lighting operation based on the gesture input and execute the lighting operation.

The third example 952c depicts a first instance 956e of a circle gesture input that may indicate a lighting operation (e.g., setting a lighting "scene") and a second instance 956f of the circle gesture input that may indicate the same lighting operation (e.g., setting a lighting "scene"). The first instance 956e may be generated by making contact at one point 954m and making a circular continuous movement contact to another point 954n. The second instance 956f may be generated by making contact at one point 954o and by making a circular continuous movement contact to another point 954p. As described above, the third touch sensor 904c may detect both the first instance 956e and the second instance 956f of the circle gesture input notwithstanding the first instance 956e and the second instance 956f are different sizes and may be detected at different locations on the third touch sensor 904c. Accordingly, the electronic device 102 may determine the lighting operation based on the gesture input and execute the lighting operation.

Figure 10:
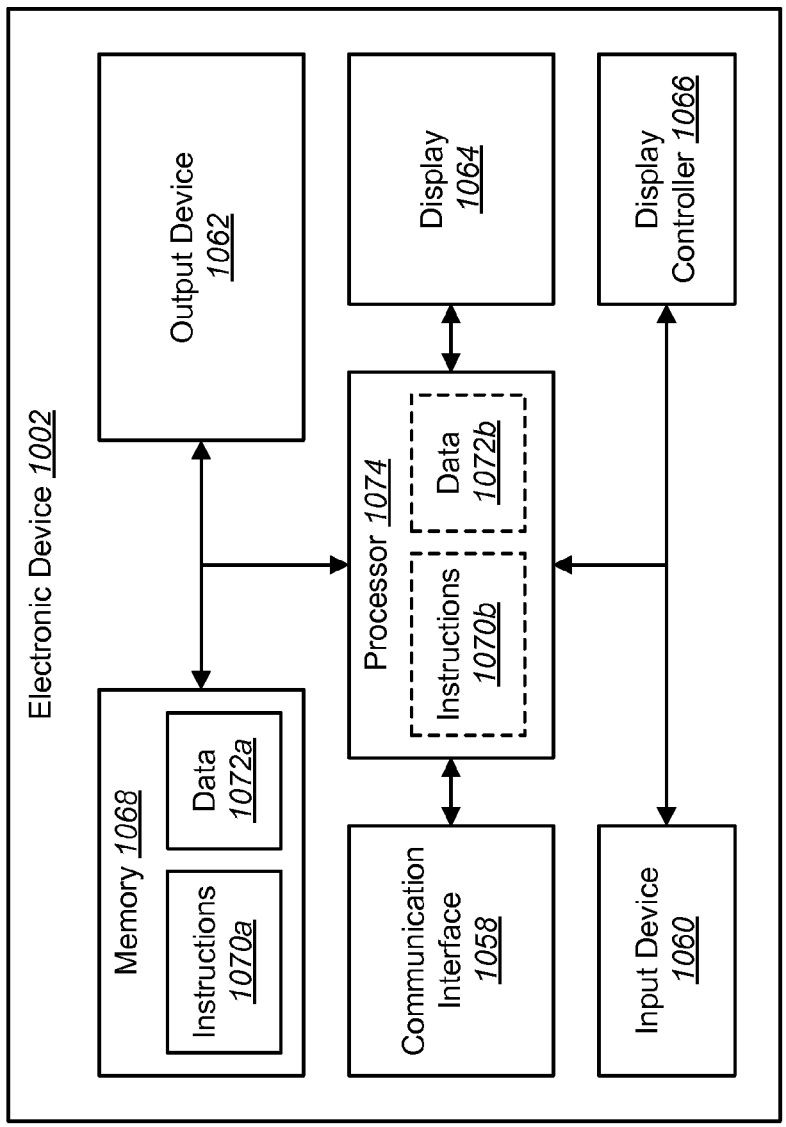
FIG. 10 is a block diagram illustrating various components that may be utilized in an electronic device.

FIG. 10 is a block diagram illustrating various components that may be utilized on an electronic device 1002. One or more of the electronic devices 102, 302, 402, 602 and 702 described previously may be configured similar to the electronic device 1002 illustrated in FIG. 10. For example, the electronic device 1002 may be configured to perform one or more of the methods 200, 500, 700 and 800 described above. The electronic device 1002 may include a processor 1074 and memory 1068. The processor 1074 may control the operation of electronic device 1002 and may be embodied as a microprocessor, a microcontroller, a digital signal processor (DSP) or other device known in the art. The processor 1074 typically performs logical and arithmetic operations based on program instructions 1070a and/or data 1072a stored within the memory 1068. The instructions 1070a in the memory 1068 may be executable to implement the methods described herein. FIG. 10 illustrates instructions 1070b and/or data 1072b being loaded onto the processor 1074. The instructions 1070b and/or data 1072b may be the instructions 1070a and/or data 1072a (or portions thereof) stored in memory 1068.

The electronic device 1002 may also include one or more communication interfaces 1058 for communicating with other electronic devices. The communication interface(s) 1058 may be based on wired communication technology and/or wireless communication technology, such as ZigBee®, WiMax®, WiFi®, Bluetooth® and/or cellular protocols, such as GSM®, etc.

The electronic device 1002 may also include one or more input devices 1060 and one or more output devices 1062. The input devices 1060 and output devices 1062 may facilitate user input/user output. A specific example of an output device is a display 1064. A display controller 1066 may control the display 1064.

Instructions 1070a and data 1072a may be stored in the memory 1068. The processor 1074 may load and execute instructions 1070b from the instructions 1070a in memory 1068 to implement various functions. Executing the instructions 1070a may involve the use of the data 1072a that is stored in the memory 1068. The instructions 1070b and/or data 1072b may be loaded onto the processor 1074. The instructions 1070 are executable to implement the one or more methods described herein and the data 1072 may include one or more of the various pieces of data described herein.

The memory 1068 may be any electronic component capable of storing electronic information. The memory 1068 may be embodied as random access memory (RAM), read-only memory (ROM), magnetic disk storage media, optical storage media, flash memory devices in RAM (Random Access Memory), on-board memory included with the processor, EPROM (Erasable Programmable Read-Only Memory), EEPROM (Electrically Erasable Programmable Read-Only Memory), an ASIC (Application Specific Integrated Circuit), registers and so forth, including combinations thereof.

In the above description, reference numbers have sometimes been used in connection with various terms. Where a term is used in connection with a reference number, it may refer to a specific element that is shown in one or more of the Figures. Where a term is used without a reference number, it may refer generally to the term without limitation to any particular Figure.

As used herein, the term "coupled" and other variations thereof may mean that one element is connected to another element directly or indirectly. For example, if a first element is coupled to a second element, the first element may be connected directly to the second element or may be connected to the second element through another element.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine and so forth. Under some circumstances, a "processor" may refer to an application specific integrated circuit (ASIC), a programmable logic device (PLD), a field programmable gate array (FPGA), etc. The term "processor" may refer to a combination of processing devices e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable or processor-readable statement(s). For example, the terms "instructions" and "code" may refer to one or more programs, routines, sub-routines, functions, procedures, etc. "Instructions" and "code" may comprise a single computer-readable statement or many computer-readable statements.

The term "computer-readable medium" refers to any available medium that can be accessed by a computer or processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. A computer-readable medium may be tangible and non-transitory. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio and microwave, then the coaxial cable, fiber optic cable, twisted pair, DSL, or wireless technologies such as infrared, radio and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An electronic device for gesture-based lighting control, comprising:
    a capacitive touch sensor that detects a gesture input, wherein detecting a gesture input comprises detecting a gesture input pressure on the capacitive touch sensor, and wherein the capacitive touch sensor detects different input pressures comprising a first pressure and a second pressure greater than the first pressure;
    a transmitter for transmitting the gesture input to an external generation device to create an association between the gesture input and the desired lighting operation during a training mode;
    a lighting operation determination module that determines a lighting operation based on the gesture input, wherein the first pressure determines a first lighting operation that directs the electronic device to remove power from one or more lighting loads under direct control of the electronic device, and wherein the second pressure determines a second lighting operation that directs the electronic device to remove power from the one or more lighting loads under direct control of the electronic device and one or more lighting loads under indirect control of the electronic device;
    a lighting operation execution module that executes the lighting operation; and
    a light emitting diode (LED) status indicator positioned behind the capacitive touch sensor, wherein the LED status indicator indicates a status of at least one lighting load.

2. The electronic device of claim 1, wherein the electronic device is configured to fit in a wall box.

3. The electronic device of claim 1, further comprising a lighting load controller that controls the at least one lighting load based on the lighting operation.

4. The electronic device of claim 1, wherein executing a lighting operation comprises sending a lighting operation indicator that directs another device to control the at least one lighting load in accordance with the lighting operation.

5. The electronic device of claim 1, wherein detecting a gesture input further comprises detecting a gesture input direction, a gesture input speed, and a gesture input pattern.

6. The electronic device of claim 1, wherein a gesture input comprises at least one continuous movement contact input.

7. The electronic device of claim 1, wherein detecting a gesture input is performed independent of a location of the gesture input on the capacitive touch sensor.

8. The electronic device of claim 1, wherein the electronic device executes a non-lighting operation based on the gesture input or another gesture input.

9. A method for gesture-based lighting control by an electronic device, comprising:
  detecting a gesture input via a capacitive touch sensor, wherein detecting a gesture input comprises detecting a gesture input pressure on the capacitive touch sensor, and wherein the capacitive touch sensor detects different input pressures comprising a first pressure and a second pressure greater than the first pressure;
  transmitting the gesture input to an external generation device to create an association between the gesture input and the desired lighting operation during a training mode;
  determining a lighting operation based on the gesture input, wherein the first pressure determines a first lighting operation that directs the electronic device to remove power from one or more lighting loads under direct control of the electronic device, and wherein the second pressure determines a second lighting operation that directs the electronic device to remove power from the one or more lighting loads under direct control of the electronic device and one or more lighting loads under indirect control of the electronic device;
  executing the lighting operation; and
  displaying, on a light emitting diode (LED) status indicator positioned behind the capacitive touch sensor, a status of at least one lighting load.

10. The method of claim 9, wherein the electronic device is configured to fit in a wall box.

11. The method of claim 9, further comprising controlling the at least one lighting load based on the lighting operation.

12. The method of claim 9, wherein executing a lighting operation comprises sending a lighting operation indicator that directs another device to control the at least one lighting load in accordance with the lighting operation.

13. The method of claim 9, wherein detecting a gesture input further comprises detecting a gesture input direction, a gesture input speed, and a gesture input pattern.

14. The method of claim 9, wherein a gesture input is a continuous movement contact input.

15. The method of claim 9, wherein detecting a gesture input is performed independent of a location of the gesture input on the capacitive touch sensor.

16. The method of claim 9, further comprising executing a non-lighting operation based on the gesture input or another gesture input.

17. The method of claim 9, further comprising displaying a quick response (QR) code that allows the external generation device to create the association.

* * * * *